United States Patent
Topchiashvili et al.

[11] Patent Number: 6,010,983
[45] Date of Patent: Jan. 4, 2000

[54] METHOD OF CONVEYOR PRODUCTION OF HIGH TEMPERATURE SUPERCONDUCTOR (HTS) WIRE, COIL, AND OTHER BULK-SHAPED PRODUCTS USING COMPOSITIONS OF HTS CERAMICS, SILVER, AND SILICONE

[76] Inventors: M. I. Topchiashvili, 451 Kings Hwy., #4, Brooklyn, N.Y. 11223; A. E. Rokhvarger, 1865 Ocean Ave., #4B, Brooklyn, N.Y. 11230

[21] Appl. No.: 09/110,580

[22] Filed: Jul. 6, 1998

Related U.S. Application Data

[60] Provisional application No. 60/051,837, Jul. 7, 1997.

[51] Int. Cl.$^7$ .............. H01L 39/24; B23B 1/52; H01B 13/22
[52] U.S. Cl. .......... 505/500; 505/230; 505/231; 505/234; 505/430; 505/431; 505/433; 505/434; 505/470; 505/490; 505/739; 505/822; 174/125.1; 264/241
[58] Field of Search .................. 505/230, 231, 505/234, 236, 400, 401, 430, 431, 433, 434, 470, 490, 500, 725, 739, 813, 822; 264/63, 241; 174/125.1

[56] References Cited

U.S. PATENT DOCUMENTS

| | | | |
|---|---|---|---|
| 4,952,554 | 8/1990 | Jin et al. | 505/230 |
| 5,017,552 | 5/1991 | Porcell | 505/100 |
| 5,210,071 | 5/1993 | LoIacono et al. | 505/100 |

FOREIGN PATENT DOCUMENTS 1058485  2/1992  China.

*Primary Examiner*—Mark Kopec
*Attorney, Agent, or Firm*—I. Zborovsky

[57] ABSTRACT

A high temperature superconductor composite material, which is suitable for production of filaments, wires, coils and other shaped products, has a ceramic powder of a material selected from the group consisting of, for example, $YBa_2Cu_3O_{7-x}$ and $Bi_2Sr_2Ca_2Cu_3O_{10}$; a solution of a material selected from the group consisting of rubber silicone or lacquer silicone in a substance selected from the group consisting of toluene or acetone; and an ultra-fine silver powder dope, and is produced by using an emulsion mixture of the three major components with ultrasonic homogenization of the mixture, primer cladding of a glue-exterior layer on a silver core filament, high temperature superconductor coating of the silver core by chemical adhesion, and polymerization of the coating applied by low temperature heating, whereafter the composition is treated by magnetic treatment, gamma irradiation, and microwave supported fast heating.

32 Claims, 3 Drawing Sheets

METHOD OF CONVEYOR PRODUCTION OF HIGH TEMPERATURE SUPERCONDUCTOR (HTS) WIRE, COIL, AND OTHER BULK-SHAPED PRODUCTS USING COMPOSITIONS OF HTS CERAMICS, SILVER, AND SILICONE

This application claims priority on provisional application Ser. No. 60/051,837, filed Jul. 7, 1997.

BACKGROUND OF THE INVENTION

The present invention relates to a high temperature superconductor composite material, and a method of producing a product from the material.

High temperature superconductor ceramic materials are known in the art. These materials possess superior qualities. At the same time, they have same disadvantages. The high temperature superconductor ceramic materials are brittle and degrade under environmental and magnetic field influences. As for the manufacturing technique, it is unknown how to make continue and quality assured high temperature superconductors wires and coils and other small and large-sized, simple and difficulty shaped products, employing conveyer mass-production method, from these very fragile ceramics to produce practical electrical energy and electronics applications. Also the discovered high temperature superconductor ceramics are very chemically active and practically degrade in air. It is believed to be clear that it is very important to develop a high temperature superconductor ceramic composite material which makes possible method of producing useful product from this material avoiding disadvantages of the prior art.

SUMMARY OF THE INVENTION

Accordingly, it is an object of the present invention to provide a new high temperature superconductor ceramic composite material which avoids the disadvantages of the prior art and effective method of production of the superior products from this material.

In keeping with these objects and with others which will become apparent hereinafter, one feature of present invention resides, briefly stated in a high temperature superconductor composite material which comprises a sintered compound of a superconductive ceramics, a silicone material selected from the group consisting of rubber silicone and lacquer silicone, and a silver dope.

Various products can be produced from the above mentioned high temperature superconductor material by the steps of preparing an emulsion of a high temperature superconductor ceramic powder of a material selected from the group consisting of, for example, $YBa_2Cu_3O_{7-x}$ and $Bi_2Sr_2Ca_2Cu_3O_{10}$, a material selected from the group consisting of rubber silicone and lacquer silicone, and an ultra-fine silver powder dope, an forming a product, treating the formed product mechanically, physically or chemically, and finally sintering the product.

When the material is composed of the above mentioned components and the product is produced by the above mentioned method, it eliminates the disadvantages of the prior art and provides for highly advantageous results.

Corresponding products can be produced by various methods, for example by coating a substrate with the inventive material to produce filament, wires, coils, cables, by extrusion of the inventive material to produce rods, beams, thick screens, wheels, by not isostatic pressing, or by slip casting to produce products with complicated shapes, etc.

When a mixture of superconductive ceramic powder with a silicone polymer and silver dope is heated in a furnace at temperatures of 800–950° C. during 4–20 hours, in oxygen medium, silicone components are subjected to destruction and organic radicals are torn from silicon, which leads to the formation of silicon, silica and carbon. Then, silica reacts with carbon to form silicon carbide:

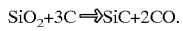

$SiO_2 + 3C \Rightarrow SiC + 2CO$.

The silicon carbide, silicon, silica and carbon are uniformly distributed in the composite material. It is possible that some components of the composite material in the conditions specified above interact with the formed silica, so as to form a complicated mixture, for example $Ba_2SiO_4$, $BaCO_3$ etc, as was confirmed by an x-ray phase analysis. These silicone residuals significantly increase electrical conductivity and magnetic field resistance of the superconductor as well as they prevent superconductor ceramic degradation. Putting into practice this scientific discovery, it makes possible to develop industrial technology of the coverage mass productions of the quality around superconductor products, which is the matter of the discovered invention.

The inventive production method obtains quality assurance and high productivity of high temperature superconductor products. There are three groups of the products:

a) other large shaped products, for example, large radar screen-shield, bar and disk for other devices, electrical storage wheel, tore and plate for levitation b) other small and super-tiny products, for example, details and elements for super capacity and super-speed computer memory, controllers and other electronic devices c) continuous filament, wire, coil and cable of any electrical engineering design nomenclature The novel features which are considered as characteristic for the present invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
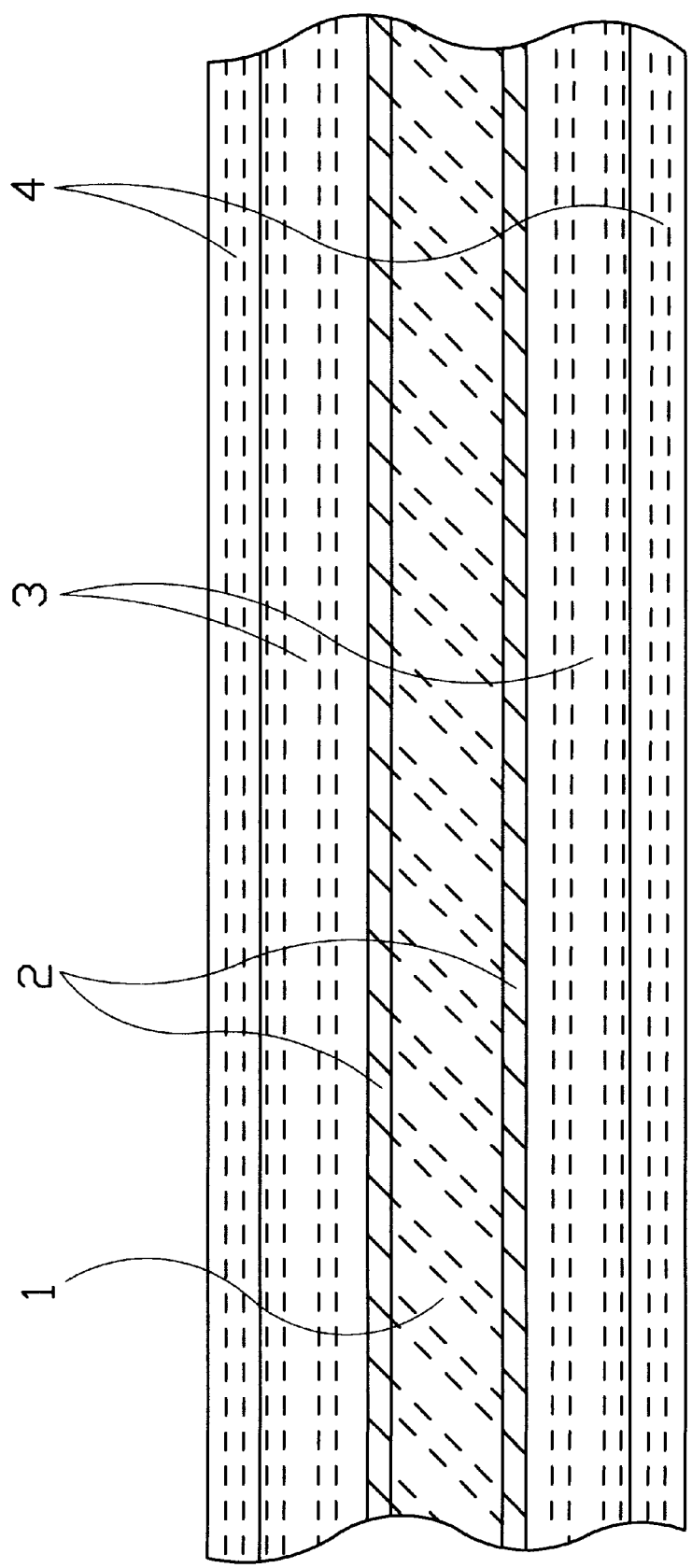
FIG. 1 is a view showing an example of the construction of a high temperature superconductor filament or wire.

In accordance with the present invention a high temperature superconductor composite material, which is suitable for conveyor production of filaments, wires, coils and other shaped products, includes a sintered compound of a superconductive ceramics, a silicone material selected from the group consisting of rubber silicone and lacquer silicone, and a silver dope.

The high temperature superconductive composite material is a material which works at liquid nitrogen and higher temperatures K>77 with critical current density $J_c > 10^4$ A/cm² and value of critical magnetic field $H_c$ within the range of 0.1–30 Tesla. In particular, it can work with the critical current density $J_c$ of $10^5$ A/cm$^2$–$10^6$ A/cm$^2$. The new high temperature superconductor composite material in accordance with present invention has specific impact strength within the range of 0.5–2 kg.cm/cm$^2$, and a long-time durability compatible with a conventional metal wire at working temperatures and conventional ambience. In the new material the synthetic silicone rubber or lacquer has molecular weight in the range of 20,000–800,000, such as synthetic silicone rubber HO—[—Si(CH$_3$)$_2$O—]—H with a molecular weight 30,000–40,000, and this synthetic silicone rubber or lacquer should be presented an emulsion of the component in the mass ratio 2%–8%, preferably 4%–6%.

The emulsion mixture of the components can be homogenized and treated by ultrasonic vibration impact during 10–60 seconds at the frequency 17–22 KGz. The method can include making an emulsion of components; and adding diethylaminmethylthrietoxisilane in a ratio of 3%–7%, preferable five weight percent of the weight of the silicone rubber or lacquer, to accelerate vulcanization process of silicone rubber or lacquer.

The vulcanization (polarization) and preliminary shaping of the article composed of the inventive high temperature superconductor composite material can be performed either in an open oven or steam autoclave when low temperature heating is provided at slow raising temperature within the range 20–200° C. during up to 6–10 hours. The shaping of the product can be performed by applying either pressure at 1–100 MPa or extrusion or slip casting method, or their combination.

In the inventive method a magnetic orientation of the ceramic sub-micro particles or crystals can be performed by applying outside magnetic field of 1–10 Telsa. Also, γ radiation of the material can be provided with the dose range $10^2$–$10^6$ Gy. The final hardening of the shaped product can be performed by ceramic sintering in an electrical furnace during 0.5–4 hours in excess of air or oxygen flow at 800–950° C. On the other hand, the final hardening of the shaped product can be performed by ceramic sintering in a microwave or hybrid electrical furnace during 0.5–20 minutes in excess of air or oxygen flow at 700–850° C.

In accordance with the present invention a quality assured inexpensive process can be used for a conveyor production of a continuous high temperature superconductor filament of any length, including 1–10 kilometers of length, and versatile designed wire, coil and cable from such filaments, employing high temperature superconductor composite material described herein above.

The method of producing a continuous high temperature superconductive filament includes providing a substrate filament selected from the group consisting of a metal or quartz glass; coating a surface of the substrate by at least one layer of the high temperature superconductor compound material; processing the coating substrate by a process selected from the group consisting of a chemical process, a physical process and a thermal process, using a conveyor consequence of the steps; and sheathing of the thusly produced product with a material selected from the group consisting of a polymer material and/or a metal sheath.

One product produced by the inventive method is shown in FIG. 1. Reference numeral 1 identifies a silver filament. An adhesive primer 2 is applied on the silver filament 1. The filament can be also composed of quartz glass. Then a high temperature superconductor composite material 3 based on silicon-organic binder is coated on the adhesive layer, and finally a protective layer 4 of silicon-organic material is applied on the outer surface.

Figure 2:
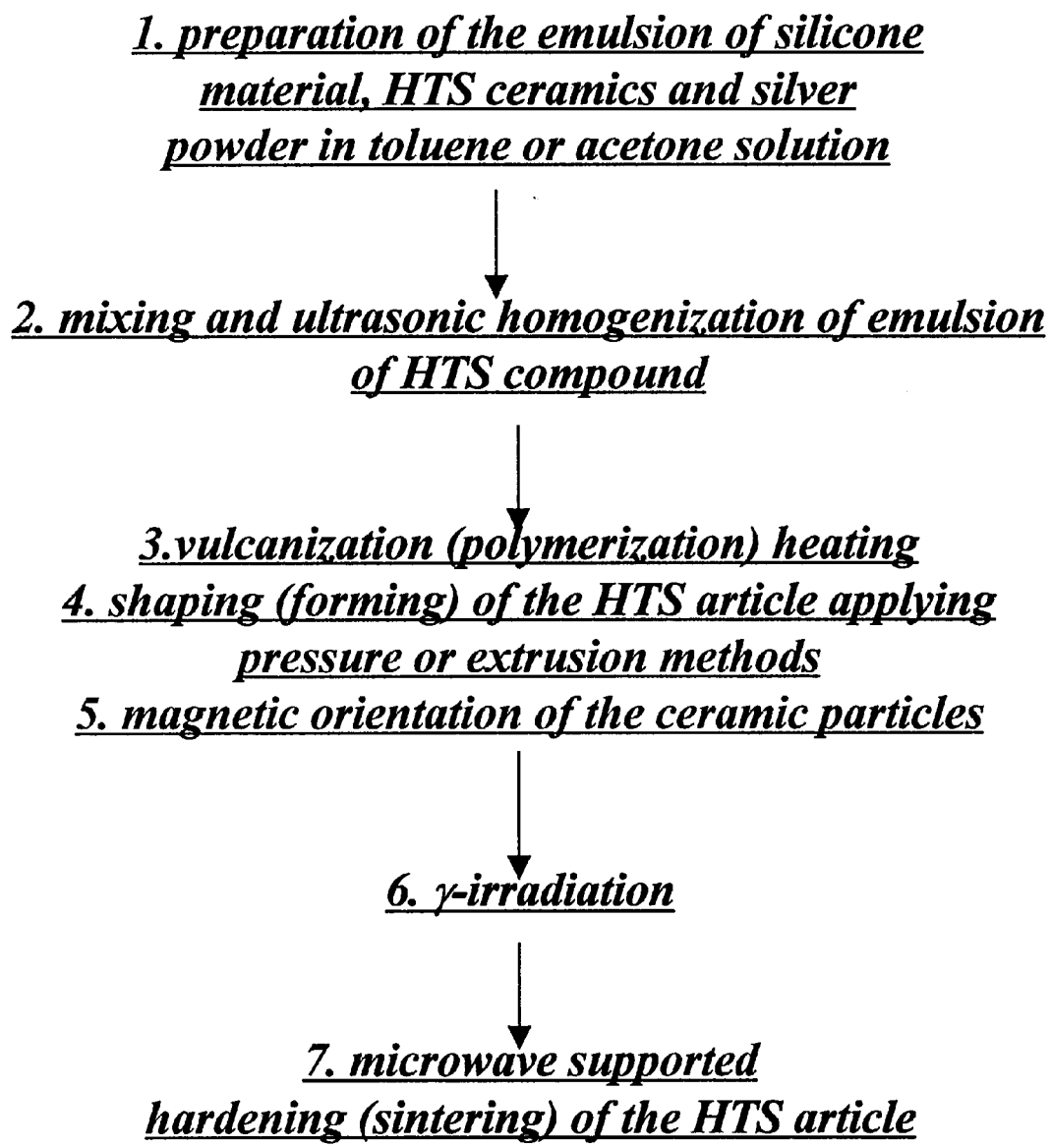
FIG. 2 is a flow chart of the method of preparing a high temperature superconductor composite material from plastic mixture and shaped product from it.
Figure 3:
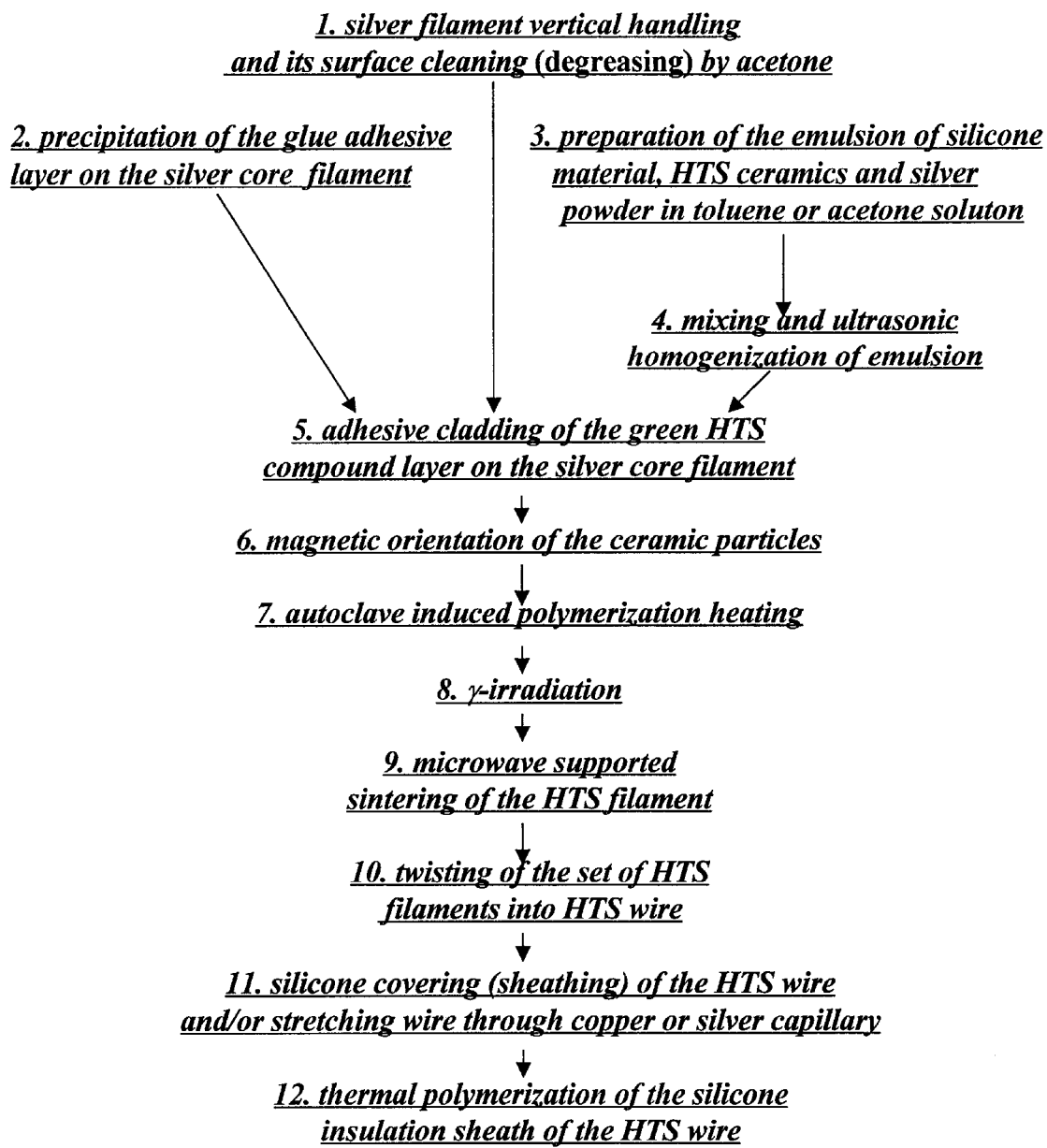
FIG. 3 is a flow chart of a method of producing a high temperature superconductor filament using invented composite emulsion.

The production methods are illustrated in FIGS. 2 and 3. According to FIG. 3, the inventive method includes precipitating an adhesive primer based on epoxy lacquer or pitch with an addition of a silver nano-powder and a hardening component on the filament based on the metal, which is silver. The inventive method also includes adhesively cladding of a green high temperature superconductor compound layer on the metal filament formed as a silver filament.

Furthermore in the inventive method an emulsion mixture of components of the high temperature superconductor composite material is produced, which emulsion also contains a substance selected from the group consisting of malein anhydride phthalein anhydride or as a hardening or polymerization and with a ratio of 30–35 weight percent of the epoxy lacquer or pitch. The method further can include polymerization of the high temperature superconductor composite material filament during 0.5–20 minutes at temperature with the range of 100° C.–220° C. in an open oven or steam autoclave. The magnetic orientation of ceramic of sub-micro particles can be performed by applying of outside magnetic fields 1–10 Tesla. Gamma radiation of the material can be provided in the dose range $10^2$–$10^6$ Gy.

The method can include either finally hardening of the high temperature superconductor filament by ceramic sintering in an electrical furnace during 0.5–4 hours in excess of oxygen flow of 800–950° C., or finally hardening of the high temperature superconductor filament by ceramic sintering a microwave supported electrical furnace during 0.1–20 in minutes in excess of oxygen flow of 700–850° C.

The high temperature superconductor filaments are compacted and twisted to form a designated high temperature superconductor wire. A silicone polymer covering to perform sheathing, and a sealing of the high temperature superconductor wire is provided by applying a vulcanization technique. The high temperature superconductor wire can be stretched through copper, silver or another capillary or a tube. Finally, the flexible high temperature superconductor wire can be wound in a coil or formed into a cable.

The special advantage of the proposed invention is a possibility to provide conveyor production of the quality assured high temperature superconductor products for all areas of the possible application of the high temperature superconductors using the same composition of the raw materials in the form of the emulsion (high temperature superconductors compound emulsion). This composition includes high temperature superconductors ceramic powder, silicone solution, and silver powder dope.

The typical second technological step is shaping or forming of the green semi-product. Third step includes a few physical treatments of the shaped green products, and fourth step consists of the high temperature sintering process, which converts green product into high temperature superconductors product.

To produce new and assured high quality high temperature superconductors products with impossible until now consumer properties for other areas of the application there are originally employed five shaping (forming) methods, including:

1) Adhesive coating (cladding) of high powder compound from high temperature superconductors compound emulsion on silver or quartz glass filament to produce continuous high temperature superconductors wire, coil and cable—see wire construction scheme on FIG. 1 and flow chart of the technological process on FIG. 3.

2) Molding (casting) of one or several thin layers of the high temperature superconductors compound emulsion on silver or quartz substrate to produce two or three dimensional high temperature superconductors film. The structure of the high temperature superconductors film can copy the substrate shape structure. The special novelty of the invention is a laser application to burn an especially precise high temperature superconductors structure of the electronic elements, for example, for super capacity computer memory super high speed elements.

3) Slip casting in particular temporary form of the high temperature superconductors compound emulsion to produce other high temperature superconductors details and devices, for example, infinite wear resistance bearings and other electrical-mechanical rotating and moving devices and special durability and precision.

4) Died on extrusion of the condensed high temperature superconductors compound emulsion to produce large size and long length high temperature superconductors products, such as rods, beams, and plates for high temperature superconductors radar screens, levitation bases, durable energy storage wheels, etc.

5) Hot isostatic pressing of the plastic high temperature superconductors compound mass from the same condensed high temperature superconductors compound emulsion to produce similar products that discussed in above point 4)—see also FIG. 2.

Examples of the proposed material and the method of producing a product are presented hereinbelow.

EXAMPLE 1

An initial composition includes:

a superconduct ceramic powder $YBa_2Cu_3O_7$—92.5 weight parts;

organo-silicate elastomer rubber $(HO-[-Si(CH_3)_2O]-H)$—5 weight parts;

dialkylaminomethyl trialkoxysilane—5 weight parts from the weight of the rubber;

silver powder—2.5 weight part; all in a toluene solution.

EXAMPLE 2

An initial composition includes:

a superconductor ceramic powder $YBa_2Cu_3-O_7$—92.5 weight parts;

polyvinyidimethyl siloxane rubber—5 weight parts;

dialkylaminomethyl trialkoxysilane—4.5 weight parts from the weight of the rubber;

silver powder—2.5 weight percent, all in a toluene solution.

EXAMPLE 3

An initial material includes:

a superconductor ceramic powder $YBa_2Cu_3O_7$—92.5 weight parts;

$HO-[-Si(CH_3)_2O-]-H$—2.5 weight percent;

polyvinyldimethyl silcoxane rubber—2.5 weight percent dialkylaminomethyl trialkoxysilane—5 weight percent from the total weight of the rubber;

silver powder—2.5 weight percent, all in a toluene solution.

EXAMPLE 4

An initial material includes:

a superconductive ceramic powder $Bi_2Sz_2Ca_2Cu_3O_{10}$—92.5 weight parts;

organo-silicate elastomer rubber $(HO-[-Si(CH_3)_2O-H)$—5 weight parts;

dialkylaminomethyl trialkoxysilane—5 weight parts from the weight of the rubber;

silver powder 2.5 weight percent all in a toluene solution.

EXAMPLE 5

An initial material includes:

a superconduct ceramic powder $Bi_2Sz_2Ca_2Cu_3O_{10}$—92.5 weight percent;

$HO-[-Si(CH_3)_2O-]-H$ 5 weight part from the weight of the rubber dialkylominomethyl trialkoxysilane—5 weight part of the weight of rubber;

silver powder—2.5 weight parts; all in a toluene solution.

A method of producing the filament is illustrated by the following example:

EXAMPLE 6

A silver filament with the thickness of 10 micron is degreased by acetone, then immersed into a bath with epoxy lacquer dissolved in acetone with the silver powder, hardened by malein or phtalein anhydride (30–35 weight parts from the weight of the epoxy resin, hardened at temperature of 130° C.). Then the filament is removed from the bath and immersed into a next bath shown in FIG. 3, in which a powder of yttrium ceramics (Y—Ba—Cu—0) with the polymer and with silver in form of powder (solution in toluene mixed by ultrasound mixer).

FIG. 3 shows the whole cycle of production of filament. Then the filament is removed from the bath and orientation of the particles of polymer-ceramic in a magnetic field of 3 Tesla is provided. Then the filament with the applied and oriented coating is introduced into a thermostat with heating from 100 to 320° C. during 0.5 hour. In order to increase the stability of the properties of the filament to action of magnetic fields, the filament is subjected to irradiation treatment with the dose of $5.10^4$ Gy. Then, the filament is sintered in a microwave furnace at the temperature of 780° C. in oxygen atmosphere during 0.5 hours. If necessary, various insulations coatings can be applied.

A method of producing a composite material in form of a solid body in accordance with the present invention is illustrated by the following example.

EXAMPLE 7

A silicon-organic rubber is dissolved in toluene, polymerizing agents are introduced into the mixture, the mixture is stirred, the polymeric component of the material is mixed with the ceramics and silver in a corresponding ratio in a glass dish until the solvent is evaporated and uniform mixture is produced by ultrasound. The obtained mixture is introduced into a press mold and pressed with the pressure of 100 MPa, in a magnetic field of 1–10 Tesla. Then the product is removed from the press mold, and after 24 hours is subjected to a thermal treatment at 100° C.—1 hour, 120° C.—1 hour, 150° C.—1 hour, 200° C.—1 hour. In order to impart superconductive properties to the product, it is annealed at a temperature of 880–950° C. in air atmosphere during 4 hours, and at 950° C. in oxygen atmosphere during 4 hours. The products that can be made are, for example, discs or washers, with a diameter of 30 mm and height 3–4 mm.

EXAMPLE 8

The product of the inventive material based on the bismuth ceramics ($Bi_2Sr_2Ca_2Cu_3O_{10}$) was produced in a similar way. However, in order to impart to the product the superconductor properties the annealing of the product was performed at temperature 1000–1100° C. in air atmosphere during 21 hour.

It will be understood that each of the elements described above, or two or more together, may also find a useful application in other types of methods and constructions differing from the types described above.

While the invention has been illustrated and described as embodied in high temperature superconductor composite material and method of producing product from the material, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A method of production a high temperature superconductor product from composite, comprising the steps of making an emulsion mixture of a superconductor ceramic powder, silicone material selected from the group consisting of rubber silicone and lacquer silicone, and an ultra-fine silver powder dope; forming a product from the emulsion; treating the formed product by a process selected from the group consisting of a chemical process, a physical process and a thermal process; and sintering the product.

2. A method as defined in claim 1, wherein the rubber silicone or lacquer silicone have a molecular weight within the range of 20,000–800,000 and is present in the material in the mass ratio 2%–8%.

3. A method as defined in claim 1, wherein the rubber silicone is a synthetic silicone rubber HO—[—Si($CH_3$)$_2$O—]—H with a molecular weight 30,000–40,000.

4. A method as defined in claim 1, wherein the silicone rubber or silicone lacquer is present in a quantity of mass ratio 4–6% of the high temperature superconductor ceramic powder.

5. A method as defined in claim 1, wherein the ultra-fine silver powder dope is present in the material with a weight ratio 1.5%–5%.

6. A method as defined in claim 5, wherein the ultra-fine silver powder dope is present in the material with a weight ratio 2%–3%.

7. A method as defined in claim 1, wherein said treating includes homogenizing the mixture, by ultrasonic vibration impact during 10–60 seconds at frequency 17–22 KGz.

8. A method as defined in claim 1; and further comprising adding diethylaminmethylthrietoxisilane in a ratio of 3%–7%, percent of the weight of the silicone rubber or silicone lacquer, to accelerate polymerization process of silicone rubber or silicone lacquer.

9. A method as defined in claim 1, wherein said treating includes polymerization and preliminary shaping of an article produced from the high temperatures superconductor composite material with a low temperature heating at slowly raising temperature within the range of 20° C.–200° C. during 6–10 hours.

10. A method as defined in claim 9, wherein the shaping includes using a process selected from the group consisting of application of pressure at 1.0–100 MPa, extrusion, slip carting and their combination.

11. A method as defined in claim 1, wherein said treating includes magnetic orienting of ceramic sub-micro particles by applying an outside magnetic field of 1–10 Tesla.

12. A method as defined in claim 1; and further comprising the step of γ irradiation of the high temperature superconductor composite material within a dose range $10^2$–$10^6$ Gy.

13. A method as defined in claim 1, wherein said sintering includes sintering in an electrical furnace during 0.5–4 hours in excess of air or oxygen flow of 800° C.–950° C.

14. A method as defined in claim 1, wherein said sintering includes sintering in a microwave supported electrical furnace during 0.5–20 minutes in excess of air or oxygen flow at 700° C.–850° C.

15. A method as defined in claim 1, and further comprising providing a substrate selected from the group consisting of a metal or quartz glass filament; coating a surface of the substrate by at least one layer of the high temperature superconductor composite material; subjecting the coated filament to said physical and thermal treating and sintering; and sheathing of the thusly produced product with a material selected from the group consisting of a polymer material and a metal sheath.

16. A method as defined in claim 15; and further comprising the step of preliminary degreasing of the surface of the metal filament or the metal wire by acetone.

17. A method as defined in claim 15; and further comprising the step of precipitating an adhesive primer based on epoxy lacquer or pitch with an addition of a silver fine powder and a hardening component on the filament based on metal which is silver.

18. A method as defined in claim 15; and further comprising adhesively cladding or carting of a green high temperature superconductor compound layer on the metal filament.

19. A method as defined in claim 15; and further comprising polymerization of the high temperature superconductor composite material filament during 0.5–20 minutes at temperature with the range of 100° C.–320° C. in an open oven or steam autoclave.

20. A method as defined in claim 15; and further comprising magnetically orienting ceramic sub-micro particles by applying outside magnetic field of 1–10 Tesla.

21. A method as defined in claim 15; and further comprising the steps of gamma irradiation of the high temperature superconductor composite material with a dose range of $10^2$–$10^6$ Gy.

22. A method as defined in claim 15; and further comprising finally hardening the high temperature superconductor filament by ceramic sintering in an electrical furnace during 0.5–4 hours in excess of air or oxygen flow at 800–950° C.

23. A method as defined in claim 15; and further comprising finally hardening the superconductor compound cladding of high temperature superconductor filament by ceramic sintering in a microwave supported electrical furnace during 0.1–20 minutes in excess of air or oxygen flow at 700–850° C.

24. A method as defined in claim 15; and further comprising compacting and twisting the high temperature superconductor filament so as to form a high temperature superconductor wire.

25. A method as defined in claim 24; and further comprising providing a silicone polymer covering and sealing of the high temperature superconductor wire with the use of polymerization hardening of the silicon sheath.

26. A method as defined in claim 24; and further comprising stretching the high temperature superconductor wire through a structure selected from the group consisting of a plastic, glass, ceramics, silver or another metal capillary and a tube.

27. A method as defined in claim 24; and further comprising bending, twisting and binding the high temperature superconductor wire to form a coil or a cable.

28. A method as defined in claim 1, wherein said forming includes molding the emulsion mixture on a silver or silica substrate to produce one or multilayer and at least two dimensional high temperature superconductor film.

29. A method as defined in claim 1, wherein said forming includes slip casting in a temporary mold of the emulsion mixture to produce a high temperature superconductor product.

30. A method as defined in claim 15, wherein said forming includes die extruding of the emulsion mixture to produce large size and long length high temperature superconductor products.

31. A method as defined in claim 1, wherein said forming includes a hot or normal temperature isostatic pressing of a plastic compound mass from high condensed said emulsion mixture, which is condensed to plastic mass consistence to produce large size and long length high temperature superconductive products.

32. A method as defined in claim 1, wherein said superconductor ceramic powder is composed of a material selected from the group consisting of $YBa_2Cu_3O_{7-6}$ and $Bi_2Sr_2Ca_2Cu_3O_{20}$.

* * * * *